United States Patent
Uzoh (10) Patent No.: US 10,985,133 B2
(45) Date of Patent: *Apr. 20, 2021

(54) DIE PROCESSING

(71) Applicant: INVENSAS BONDING TECHNOLOGIES, INC., San Jose, CA (US)

(72) Inventor: Cyprian Emeka Uzoh, San Jose, CA (US)

(73) Assignee: INVENSAS BONDING TECHNOLOGIES, INC., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/910,432

(22) Filed: Jun. 24, 2020

(65) Prior Publication Data

US 2020/0321307 A1 Oct. 8, 2020

Related U.S. Application Data (63) Continuation of application No. 16/515,588, filed on Jul. 18, 2019, now Pat. No. 10,714,449, which is a
(Continued)

(51) Int. Cl.
*H01L 23/00* (2006.01)
*H01L 21/67* (2006.01)
(Continued)

(52) U.S. Cl.
CPC ........ *H01L 24/80* (2013.01); *H01L 21/67046* (2013.01); *H01L 21/67051* (2013.01);
(Continued)

(58) Field of Classification Search
CPC ... H01L 24/80; H01L 25/065; H01L 21/6838; H01L 23/48; H01L 25/50; H01L 21/67051
See application file for complete search history.

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

JP 2013033786 A 2/2013
JP 2018160519 A 10/2018
(Continued)

OTHER PUBLICATIONS

Ker, Ming-Dou et al., "Fully Process-Compatible Layout Design on Bond Pad to Improve Wire Bond Reliability in CMOS ICs," IEEE Transactions in Components and Packaging Technologies, Jun. 2002, vol. 25, No. 2, pp. 309-316.
(Continued)

*Primary Examiner* — Anthony Ho
(74) *Attorney, Agent, or Firm* — Lee & Hayes, P.C.

(57) ABSTRACT

Representative implementations provide techniques and systems for processing integrated circuit (IC) dies. Dies being prepared for intimate surface bonding (to other dies, to substrates, to another surface, etc.) may be processed with a minimum of handling, to prevent contamination of the surfaces or the edges of the dies. The techniques include processing dies while the dies are on a dicing sheet or other device processing film or surface. Systems include integrated cleaning components arranged to perform multiple cleaning processes simultaneously.

18 Claims, 10 Drawing Sheets

Related U.S. Application Data continuation of application No. 16/282,024, filed on Feb. 21, 2019, now Pat. No. 10,515,925, which is a continuation of application No. 15/936,075, filed on Mar. 26, 2018, now Pat. No. 10,269,756.

(60) Provisional application No. 62/563,847, filed on Sep. 27, 2017, provisional application No. 62/488,340, filed on Apr. 21, 2017.

(51) Int. Cl.
*H01L 23/48* (2006.01)
*H01L 25/065* (2006.01)
*H01L 21/683* (2006.01)
*H01L 21/78* (2006.01)
*H01L 25/00* (2006.01)

(52) U.S. Cl.
CPC .. *H01L 21/67132* (2013.01); *H01L 21/67253* (2013.01); *H01L 21/6836* (2013.01); *H01L 21/6838* (2013.01); *H01L 21/78* (2013.01); *H01L 23/48* (2013.01); *H01L 24/97* (2013.01); *H01L 25/065* (2013.01); *H01L 25/50* (2013.01); *H01L 21/67144* (2013.01); *H01L 24/81* (2013.01); *H01L 2221/68322* (2013.01); *H01L 2221/68336* (2013.01); *H01L 2221/68363* (2013.01); *H01L 2221/68381* (2013.01); *H01L 2224/80006* (2013.01); *H01L 2224/80011* (2013.01); *H01L 2224/80012* (2013.01); *H01L 2224/80013* (2013.01); *H01L 2224/80019* (2013.01); *H01L 2224/80031* (2013.01); *H01L 2224/80895* (2013.01); *H01L 2224/80896* (2013.01); *H01L 2224/81005* (2013.01); *H01L 2224/81801* (2013.01); *H01L 2224/97* (2013.01)

(56) References Cited

U.S. PATENT DOCUMENTS

| | | | |
|---|---|---|---|
| 6,080,640 A | 6/2000 | Gardner et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu et al. | |
| 8,809,123 B2 | 8/2014 | Liu et al. | |
| 9,142,517 B2 | 9/2015 | Liu et al. | |
| 9,171,756 B2 | 10/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,337,235 B2 | 5/2016 | Chen et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,799,587 B2 | 10/2017 | Fujii et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 9,971,777 B2 | 5/2018 | Bertin et al. | |
| 10,026,605 B2 | 7/2018 | Doub et al. | |
| 10,075,657 B2 | 9/2018 | Fahim et al. | |
| 10,269,756 B2 | 4/2019 | Uzoh | |
| 10,276,619 B2 | 4/2019 | Kao et al. | |
| 10,714,449 B2 * | 7/2020 | Uzoh .................. H01L 21/6838 |
| 2004/0084414 A1 | 5/2004 | Sakai et al. | |
| 2006/0057945 A1 | 3/2006 | Hsu et al. | |
| 2007/0111386 A1 | 5/2007 | Kim et al. | |
| 2009/0298264 A1 | 12/2009 | Arai et al. | |
| 2014/0175655 A1 | 6/2014 | Chen et al. | |
| 2015/0064498 A1 | 3/2015 | Tong | |
| 2015/0255349 A1 | 9/2015 | Holden et al. | |
| 2016/0343682 A1 | 11/2016 | Kawasaki | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |

FOREIGN PATENT DOCUMENTS

| | | | |
|---|---|---|---|
| WO | 2000059006 A1 | 10/2000 | |
| WO | 2005043584 A2 | 5/2005 | |
| WO | 2009158378 A2 | 12/2009 | |

OTHER PUBLICATIONS

International Search Report and Written Opinion, dated Jul. 17, 2018, for PCT Application No. PCT/2018/025694, Filed Apr. 2, 2018, 25 pages.

Moriceau, H. et al., "Overview of Recent Direct Wafer Bonding Advances and Applications," Advances in Natural Sciences—Nanoscience and Nanotechnology, 2010, 12 pages.

Oberhammer et al., "Sealing of Adhesive Bonded Devices on Wafer Level," in Sensors and Actuators A., vol. 110, No. 1-3, pp. 407-412, Feb. 29, 2004, see pp. 407-412; and figures 1(a)-1(l), 6 pages.

Nakanishi, H. et al., "Studies on SiO2—SiO2 Bonding with Hydrofluoric Acid, Room Temperature and Low Stress Bonding Technique for MEMS," Tech. Research Lab., 200, Elsevier Science S.A., 8 pages.

Plobi et al., "Wafer Direct Bonding: Tailoring Adhesion Between Brittle Materials," Materials Science and Engineering Review Journal, 1999, 88 pages.

* cited by examiner

DIE PROCESSING

PRIORITY CLAIM AND CROSS-REFERENCE TO RELATED APPLICATION

This application is a continuation of and claims the benefit of priority under 35 U.S.C. § 120 from U.S. patent application Ser. No. 16/515,588, filed Jul. 18, 2019, now U.S. Pat. No. 10,714,449, issued on Jul. 14, 2020, which is a continuation of and claims the benefit of priority under 35 U.S.C. § 120 from U.S. patent application Ser. No. 16/282,024, filed Feb. 21, 2019, now U.S. Pat. No. 10,515,925, issued Dec. 24, 2019, which is a continuation of U.S. patent application Ser. No. 15/936,075, filed Mar. 26, 2018, now U.S. Pat. No. 10,269,756, issued Apr. 23, 2019, which claims the benefit of priority to U.S. Provisional Patent Application No. 62/563,847, filed Sep. 27, 2017, and U.S. Provisional Patent Application No. 62/488,340, filed Apr. 21, 2017, which are hereby incorporated by reference in their entirety.

FIELD

The following description relates to processing of integrated circuits ("ICs"). More particularly, the following description relates to devices and techniques for processing IC dies.

BACKGROUND

The demand for more compact physical arrangements of microelectronic elements such as integrated chips and dies has become even more intense with the rapid progress of portable electronic devices, the expansion of the Internet of Things, nano-scale integration, subwavelength optical integration, and more. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking, sensors, memories, microprocessors, healthcare electronics, automatic electronics, and more, all in a pocket-size device. Complex portable devices require packing numerous chips and dies into a small space.

Microelectronic elements often comprise a thin slab of a semiconductor material, such as silicon or gallium arsenide or others. Chips and dies are commonly provided as individual, prepackaged units. In some unit designs, the die is mounted to a substrate or a chip carrier, which is in turn mounted on a circuit panel, such as a printed circuit board (PCB). Dies can be provided in packages that facilitate handling of the die during manufacture and during mounting of the die on the external substrate. For example, many dies are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. The terminals typically are connected to the contacts (e.g., bond pads or metal posts) of the die by conductive features such as thin traces extending along the die carrier and by fine leads or wires extending between the contacts of the die and the terminals or traces.

In a surface mounting operation, the package may be placed onto a circuit board so that each terminal on the package is aligned with a corresponding contact pad on the circuit board. Solder or other bonding material is generally provided between the terminals and the contact pads. The package can be permanently bonded in place by heating the assembly so as to melt or "reflow" the solder or otherwise activate the bonding material.

Many packages include solder masses in the form of solder balls that are typically between about 0.025 mm and about 0.8 mm (1 and 30 mils) in diameter, and are attached to the terminals of the package. A package having an array of solder balls projecting from its bottom surface (e.g., surface opposite the front face of the die) is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This scale is advantageous in that it reduces the overall size of the assembly and permits the use of short interconnections between various devices on the substrate, which in turn limits signal propagation time between devices and thus facilitates operation of the assembly at high speeds.

Semiconductor dies can also be provided in "stacked" arrangements, wherein one die is provided on a carrier, for example, and another die is mounted on top of the first die. These arrangements can allow a number of different dies to be mounted within a single footprint on a circuit board and can further facilitate high-speed operation by providing a short interconnection between the dies. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package). This has been done, for example, by providing contact pads or lands on both sides of the substrate to which the die is mounted, the pads being connected through the substrate by conductive vias or the like. Examples of stacked chip arrangements and interconnect structures are provided in U.S. Patent App. Pub. No. 2010/0232129, the disclosure of which is incorporated by reference herein.

Dies or wafers may also be stacked in other three-dimensional arrangements as part of various microelectronic packaging schemes. This can include stacking layers of one or more dies or wafers on a larger base die or wafer, stacking multiple dies or wafers in vertical or horizontal arrangements, or stacking similar or dissimilar substrates, where one or more of the substrates may contain electrical or non-electrical elements, optical or mechanical elements, and/or various combinations of these. Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company (see for example, U.S. Pat. Nos. 6,864,585 and 7,485,968, which are incorporated herein in their entirety). When bonding stacked dies using a direct bonding technique, it is usually desirable that the surfaces of the dies to be bonded be extremely flat and smooth. For instance, in general, the surfaces should have a very low variance in surface topology, so that the surfaces can be closely mated to form a lasting bond. For example, it is generally preferable that the variation in roughness of the bonding surfaces be less than 3 nm and preferably less than 1.0 nm.

Some stacked die arrangements are sensitive to the presence of particles or contamination on one or both surfaces of the stacked dies. For instance, particles remaining from processing steps or contamination from die processing or tools can result in poorly bonded regions between the stacked dies, or the like. Extra handling steps during die processing can further exacerbate the problem, leaving behind unwanted residues.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Various embodiments of techniques and systems for processing integrated circuit (IC) dies are disclosed. Dies being prepared for intimate surface bonding (to other dies, to substrates, to another surface, etc.) may be processed with a minimum of handling, to prevent contamination of the surfaces or the edges of the dies.

The techniques include processing dies while the dies are on a dicing sheet or other device processing film or surface, according to various embodiments. For example, the dies can be cleaned, ashed, and activated while on the dicing sheet (eliminating a number of processing steps and opportunities for contamination during processing). The processing can prepare the dies to be bonded in stacked arrangements, for instance. After processing, the dies can be picked directly from the dicing sheet and placed on a prepared die receiving surface (another die, a substrate, etc.) for bonding to the surface.

In various embodiments, using the techniques disclosed can reduce die fabricating and processing costs and can reduce the complexity of fabricating electronic packages that include the dies. Dies to be stacked and bonded using "ZIBOND®" and "Direct Bond Interconnect (DBI®)" techniques, which can be susceptible to particles and contaminants, can particularly benefit. Whether the manufacturing process includes bonding two surfaces using a low temperature covalent bond between two corresponding semiconductor and/or insulator layers (the process known as ZIBOND®), or whether the manufacturing process also includes forming interconnections along with the bonding technique (the process known as DBI®), high levels of flatness and cleanliness are generally desirable across the bonding surfaces.

The techniques disclosed may also be beneficial to other applications where, for example, the bonding region of the device may comprise flowable mass material such as any form of solderable material for bonding. Minimizing or eliminating particles or dirt between the bonding surfaces can dramatically improve yield and reliability. In an implementation, large batches of dies can be processed at a time, using large die or wafer carriers such as large dicing sheets, using multiple die or wafer carriers, or the like.

In some embodiments, several process steps can be eliminated, lowering manufacturing complexity and costs, while improving the overall cleanliness of the dies (e.g., reducing the occurrence of particles, contaminants, residue, etc.). Reduced handling of the dies can also minimize particle generation.

Figure 1:
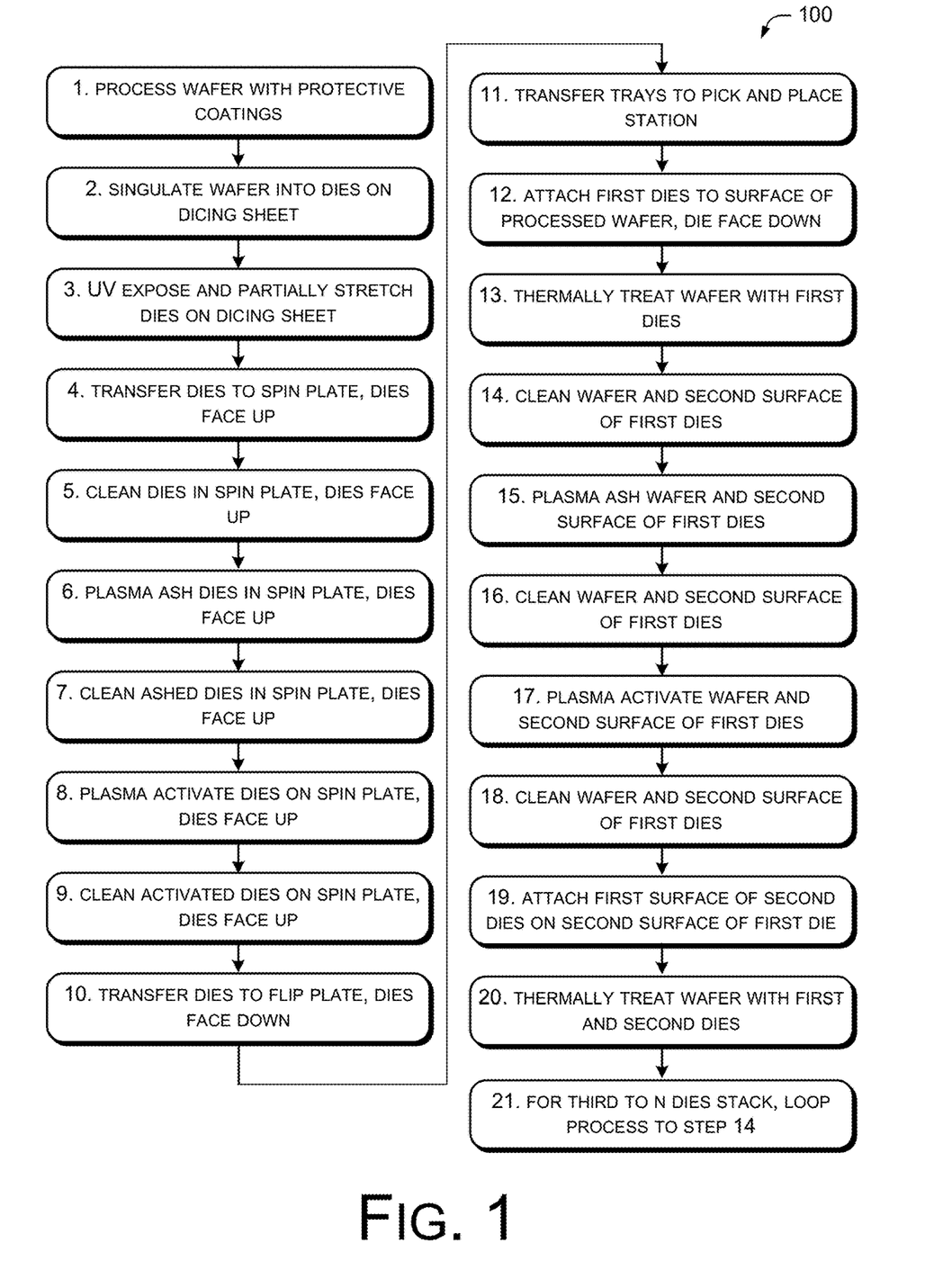
FIG. 1 is a textual flow diagram illustrating an example die processing sequence using a spin plate.

A flow diagram is shown at FIG. 1, illustrating an example die or device processing sequence 100, using a spin plate to hold the dies during processing. At blocks 1-4 the process begins with preparing a substrate, for example a silicon wafer, by applying protective coatings to one or both sides of the wafer, singulating the wafer into dies (i.e., a first set of dies) on a dicing sheet or the like, exposing the dies and dicing sheet to ultraviolet (UV) radiation and stretching the dicing sheet, and transferring the dies to a spin plate, with the dies face up. At blocks 5-9 the process includes the steps of cleaning organic layers from the dies, plasma ashing the top surface of the dies to remove any remnant organic residues on the dies, and further cleaning the dies with deionized water (DI), for example, plasma activating the top surface of the dies, and re-cleaning the dies.

At block 10, the dies are transferred to a flip plate, to position the dies face down (i.e. the active surfaces (e.g., first surfaces) of the dies are facing downward or toward the flip plate). At block 11, the dies are transferred to a pick and place station. In this arrangement, the dies are picked from their back surface (e.g., the surface opposite the face, front or first surface, or active surface) and placed face down on a prepared receiving surface for bonding. To pick up the dies, the picking vacuum tool (for instance) contacts the back or second surface of the dies, which is opposite to the surface being bonded.

The receiving surface may include a prepared surface such as a substrate, another die, a dielectric surface, a polymeric layer, a conductive layer, the surface of an interposer, another package, the surface of a flat panel, or even the surface of another circuit or a silicon or non-silicon wafer. The material of the dies may be similar or dissimilar to the materials of the receiving substrate. Also, the surface of the dies may be dissimilar to the surface of the receiving substrate.

At block 13, the dies placed on the substrate are thermally treated to enhance the bond between the surface of the dies and the receiving surface of the substrate. In some embodiments, additional dies may be attached to the back (e.g., second) surface or available surface of the bonded dies. The back surface may additionally have active devices therein.

At blocks 14-18 the receiving surface, for example the substrate, and the exposed back surface of the bonded dies are cleaned, plasma ashed, re-cleaned, plasma activated, and cleaned again. At block 19 a second set of dies (with the top surface previously prepared as described at blocks 1-11) may be attached to the first set of dies (forming a stacked die arrangement). In an example, the front prepared surface (e.g., first surface) of the second dies is attached to the exposed back surface (e.g., second surface) of the first dies. At block 20, the assembly with the first and second dies is thermally treated to enhance the bonding of the stack. For additional dies to be added to the stacked die arrangement (e.g., third or more dies), the process is looped back to block 14, and continues until the desired quantity of dies has been added to each stack.

In various examples, the manufacturing process as described can use at least or approximately $13+7(n-1)$; $n>0$ steps to complete (where n=the desired quantity of dies in the stack).

In some cases, in spite of the numerous cleaning steps included in the process, the dies are left with some contamination or particles on one or more surfaces of the dies. For instance, a top or front surface of a die may be cleaned free of contamination while a bottom or back surface of the die may be left with particles or contamination. Additionally, handling the dies during the multiple processing steps can add particles or contaminants to the dies. For example, tools used during handling can transfer contaminants to the dies. The location of the particles or defects on the dies can determine whether the particles or defects can be potentially problematic for the stacked arrangement. For instance, some particles and defects can cause poor bonding between stacked dies, and the like. In another example, the device flipping step can be a source of contamination or defects, because the cleaned top surface of the device comes in contact with another surface after the flipping operation.

Example Implementations

Figure 2:
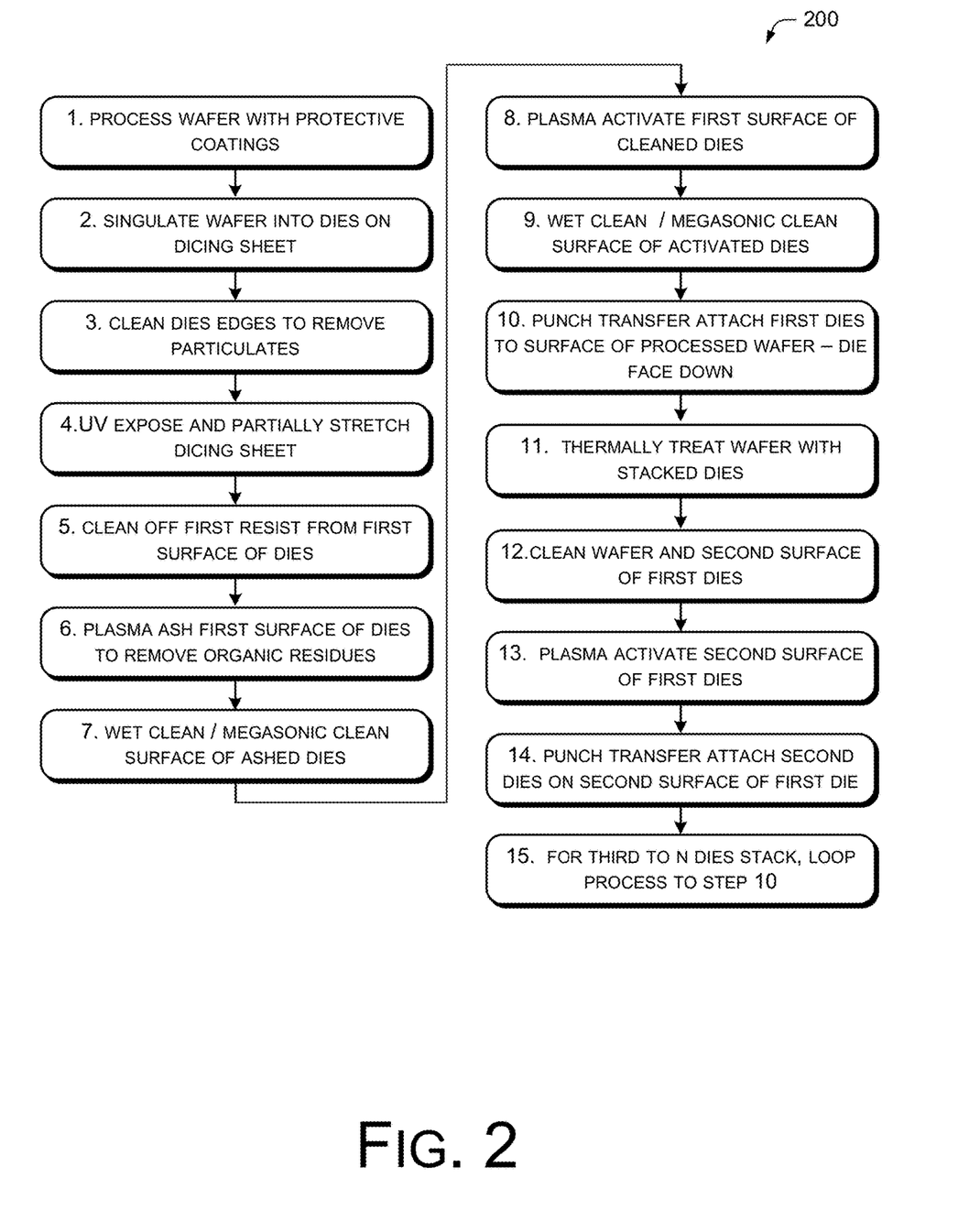
FIG. 2 is a textual flow diagram illustrating an example die processing sequence performed on a dicing tape or device processing film or surface, according to an embodiment.
Figure 3:
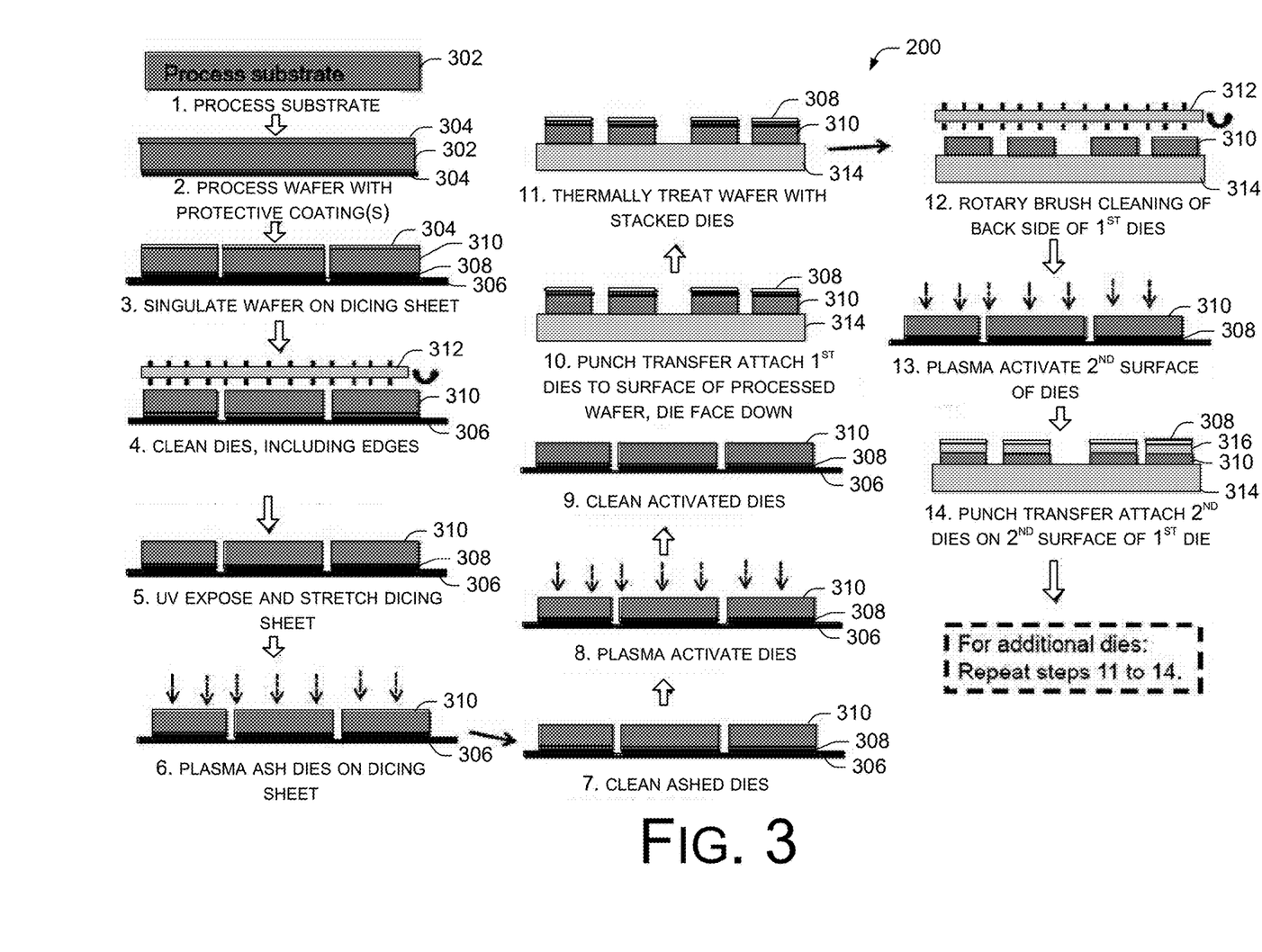
FIG. 3 is a graphical flow diagram of the example die processing sequence of FIG. 2, according to an embodiment.

FIG. 2 is a flow diagram illustrating an example die processing sequence 200, where the dies are processed on a carrier such as a dicing tape ("dicing sheet") or other processing sheet, according to an embodiment. FIG. 3 shows a graphical flow diagram representation of the process 200, according to an example implementation. The process 200 is discussed with reference to FIG. 2 and FIG. 3, however, "blocks" referred to in this discussion refer to the numbered blocks at FIG. 2, unless specified otherwise.

At block 1, a wafer 302 is processed, including adding one or more protective layers or coatings 304 to one or both surfaces of the wafer 302 (block 2). The protective layers 304 may include photoresists, or similar protectants. The wafer 302 is transferred to a dicing sheet 306 and temporarily fixed to the dicing sheet 306 with an adhesive 308. At block 3, the wafer 302 is singulated into dies 310 while on the dicing sheet 306.

At block 4, the dies 310 are cleaned to remove particles, including the edges of the dies 310, while attached to the dicing sheet 306. The cleaning can be performed mechanically and/or chemically. For example, the dies 310 may bombarded with fine $CO_2$ particles and/or exposed to a brush cleaning step which may be ultrasonically or megasonically enhanced. The brush 312 (as shown in FIG. 3) may rotate in any direction or otherwise move relative to the die 310 surface. The die 310 may additionally or alternatively be exposed to a wet etch, water pick, and so forth. At block 5, the dicing sheet 306 may be slightly stretched to create spaces between dies 310, to accommodate cleaning the edges of the dies 310. The dies 310 on the dicing sheet 306 may be exposed to ultraviolet (UV) radiation to break down the resist 304 and/or adhesive 308 layers. The dicing sheet 306 may be further stretched if needed to prepare the dies 310 for removal from the dicing sheet 306.

At block 6, remaining residue of the resist layer 304 is cleaned off of the exposed surface (e.g., first surface) of the dies 310, while the dies 310 are on the dicing sheet 306. A cleaning solution may be used, as well as other chemical and/or mechanical cleaning techniques such as those described herein. Additionally, the first (e.g., exposed) surface of the dies 310 is plasma ashed (e.g., oxygen ashing) while the dies 310 remain on the dicing sheet 306, to remove any unwanted organic residue.

At block 7, the first surface of the dies 310 is cleaned again, using a wet cleaning technique (e.g., deionized water, cleaning solution, etc.), which may include megasonic scrubbing, mechanical brush scrubbing, or agitation, or other suitable cleaning techniques. For example, in some instances, after the ashing step, additional cleaning may be performed by a wet cleaning and/or by $CO_2$ particle stream, or a rotary brush, water pick, or megasonic assisted wet cleaning technique, or combinations thereof.

At block 8, the first surface of the dies 310 is plasma activated (e.g., nitrogen plasma, etc.) to create or enhance bonding for stacking the dies 310. At block 9, the activated dies 310 are cleaned using a wet cleaning technique (e.g., deionized water, hot deionized water, water vapor, or a high pH cleaning solution, etc.), that may be enhanced with megasonics, or a combination of cleaning techniques described above, or the like.

At block 10, the dies 310 (e.g., known good dies) 310 are transferred from the dicing sheet 306 to the receiving surface 314 (a prepared die, a substrate, etc.) for bonding to the receiving surface 314. In some cases, the various cleaning and surface activating processes that are discussed above may be performed on the exposed surface of the dies 310 and/or the receiving surface 314.

Figure 4A:
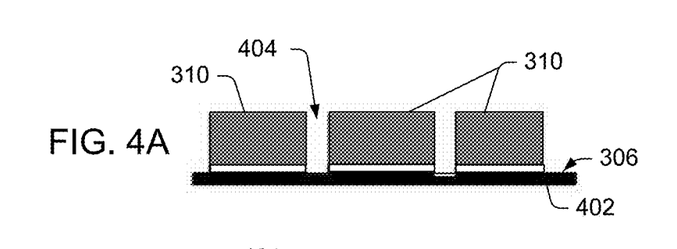
FIGS. 4A-4E graphically illustrate example steps for transferring dies from a dicing sheet to a wafer or a surface, according to an embodiment.
Figure 4B:
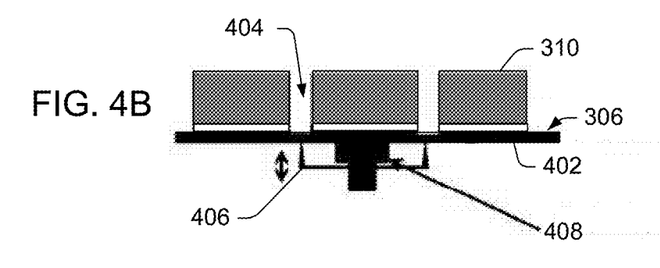
Figure 4C:
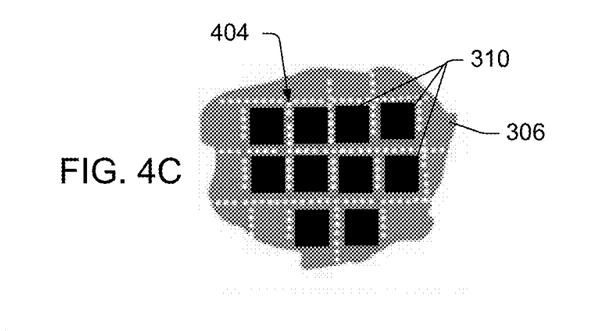
Figure 4D:
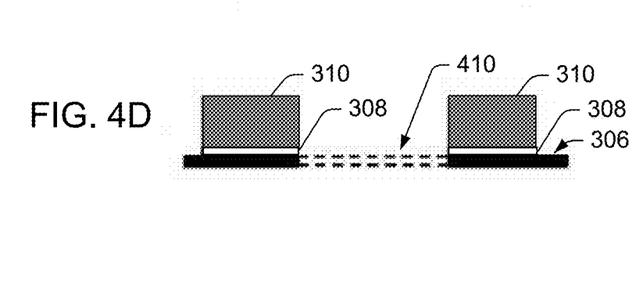
Figure 4E:
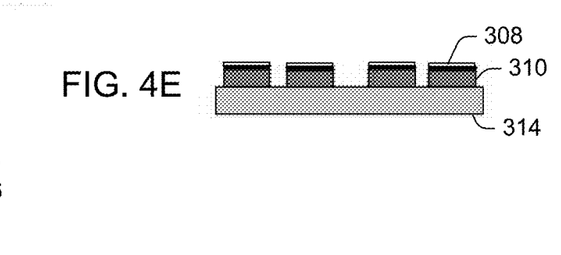
Figure 5A:
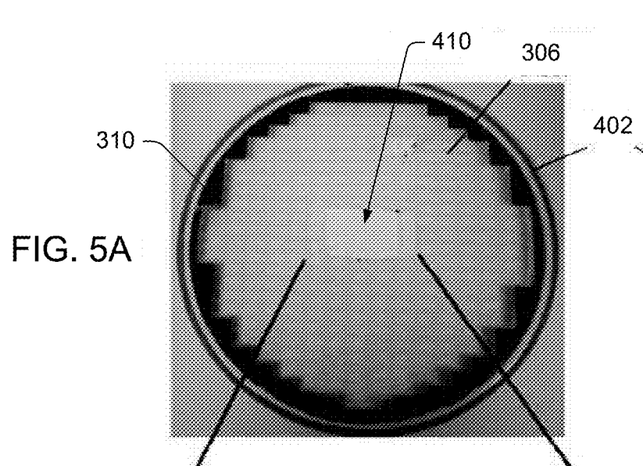
FIGS. 5A-5C illustrate example dicing sheets, with dies removed, according to an embodiment.
Figure 5B:
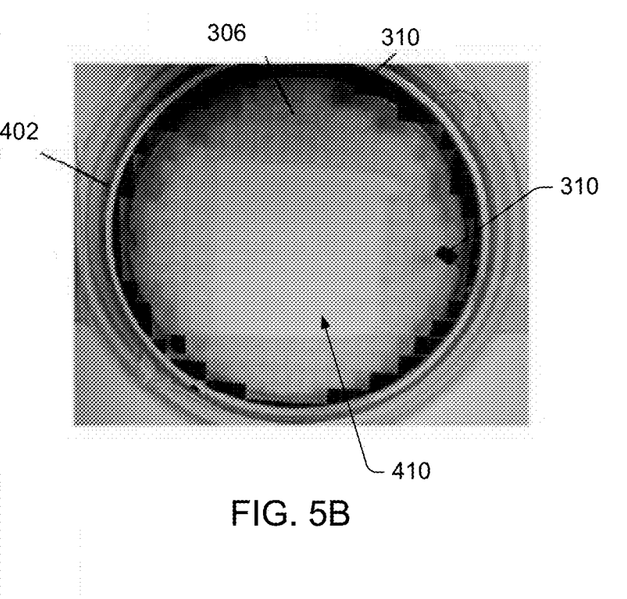
Figure 5C:
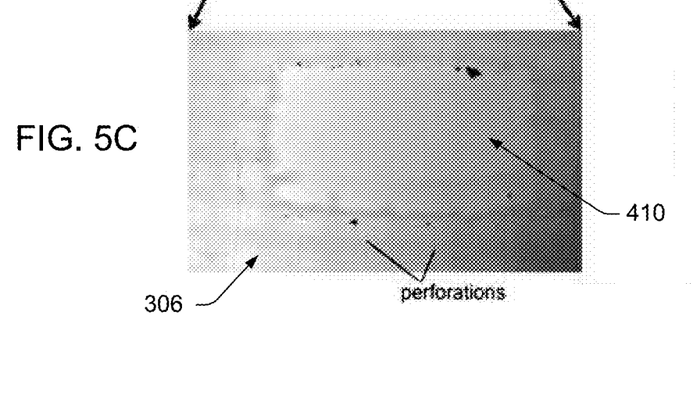

In various embodiments, the dies 310 are transferred from the dicing sheet 306 using a "punch" technique (as illustrated in FIGS. 4 and 5). The punch technique allows the dies 310 (e.g., known good dies) to be transferred without contaminating a surface or an edge of the dies 310. Also, the punch technique allows the dies 310 (e.g., known good dies) to be bonded to the bonding surface 314 "face down," that is with the first surface of the dies 310 facing the receiving surface 314, using a DBI hybrid bonding technique, solder bumping, or the like.

In one example, as shown in FIGS. 4 (A), 5(A), and 5 (B), the stretched dicing sheet 306 is held by a grip ring 402, or a frame, or the like. The dies 310 on the dicing sheet 306 are separated by gaps 404 (about 2 um-200 um wide), which may be due at least in part to the stretching. As shown at FIGS. 4(B) and 4(C), the dicing sheet 306 may be perforated along the gaps 404 between dies 310 using one or more of various tools 406, such as a dicing blade, hot knife, an optical knife (laser ablation), etc. In an embodiment, the perforating allows the dies 310 (e.g., known good dies) to be punched from the dicing sheet 306 individually, leaving the other dies 310 in place on the dicing sheet 306. A vacuum tool 408 or the like (i.e., "pick up head") can be used to punch individual dies 310 from the perforated dicing sheet 306 (as shown at FIG. 4(B)), from the back of the dicing sheet 306, for example. The vacuum tool 408 is able to transfer the dies 310 (e.g., known good dies) from the surface of the dicing tape 306 opposite the die 310, with a portion of the dicing tape 306 (or processing sheet) in place between the tool 408 and the die 310. Thus, the die 310 (e.g., known good die) arrives at the bonding surface 314 without the vacuum tool 408 contaminating the to-be-bonded surface or an edge of the die 310. The portion of the tape 306 that remains attached to the back surface of the die 310 (e.g., known good die) thereby protects the die 310 from being contaminated by contact with the tool 408.

FIG. 4(D) shows a profile view of the dicing sheet 306 with a die 310 removed. There is a hole 410 in the dicing sheet 306, since a portion of the dicing sheet 306 is removed with the die 310. (This is further shown at FIGS. 5(A)-5(C).) FIG. 4(E) shows a number of dies 310 placed on a substrate 314 for bonding.

In another embodiment, the device pick up head 408 (e.g., vacuum tool), picks the die 310 (e.g., known good die) from the backside of the die 310 (e.g., known good die) through the dicing sheet 306, as simultaneously a corresponding tool ablates the dicing sheet 306 around the perimeter of the die 310 with a laser source (or the like). In some applications, during the die 310 pick up by the vacuum tool 408 from the back side, a heated knife 406 edge may be used to melt the dicing sheet 306 around the die 310 to fully separate the die 310 from the dicing sheet 306. Inert gas may be applied to the surface of the dies 310 to prevent smoke or other contaminants from the device separation step from contaminating the cleaned surface of the dies 310. In other embodiments, vacuum may be used in place of the inert gas, while in further embodiments, both inert gas and vacuum are used to protect the surface of the dies 310 during the device separation process.

In various implementations, the cleaned, exposed surface of the die 310 is not touched by any another surface or material except the surface of the receiving substrate 314. This is in contrast to some prior techniques, wherein the cleaned surface of the die 310 (e.g., known good die) generally contacts some portion of the receiving flip plate. In other common techniques, a vacuum pickup device 408, for example, may pick up the clean dies 310 (e.g., known good dies) by touching a portion of the cleaned die 310 surface, which can result in contaminating the touched surface.

Referring back to FIGS. 2 and 3, at block 11, the wafer or substrate 314 with the newly stacked dies 310 is thermally treated (e.g., to 50-150° F.) to strengthen the bonding of the dies 310 to the substrate 314. At block 12, the current exposed surface ("back surface" or "second surface") of the dies 310 and the substrate 314 are prepared by chemical and/or mechanical cleaning techniques (e.g., surfactant, non-PVA rotary brush, megasonics, etc.). This removes any remaining adhesive 308, dicing sheet 306, protective layers 304, or other residue from the back surface of the dies 310. At block 13, the back surface of the dies 310 is plasma activated to prepare for further bonding.

At block 14, additional prepared dies 316 are separated by the techniques disclosed herein and disposed with the first surface "face down" (e.g., active side down, prepared side down, etc.) on the prepared back (e.g., second) surface of the dies 310 previously placed on the substrate 314, for example. The newly added dies 316 are thermally treated (e.g., block 11) to strengthen the bonds to the dies 310. For additional dies 316 to be added to the stacked die arrangement (e.g., third or more dies), the process is looped back to block 12, and continues until the desired quantity of dies 310, 316 has been added to each stack.

In various examples, the manufacturing process as described can use approximately 11+2(n−1); n>0 steps to complete (where n=the desired quantity of dies 310, 316 in the stack). This represents a significant reduction in manufacturing steps when compared to the process described with respect to FIG. 1: (13+7(n−1)). Not only is manufacturing cost and complexity reduced by reducing process steps, but opportunities to contaminate the dies 310 are also reduced, resulting in better quality and higher throughput with lower cost. The reduced processing steps translate to a cost savings per die 310, and the elimination of a spin plate (or like processing component) translates to further manufacturing cost savings. For example, approximately 50 to 100 dies 310 can be processed at a time using spin plates, and approximately 200 to 10,000 dies 310 or more can be processed at a time using a dicing sheet 306 process as described.

Figure 6:
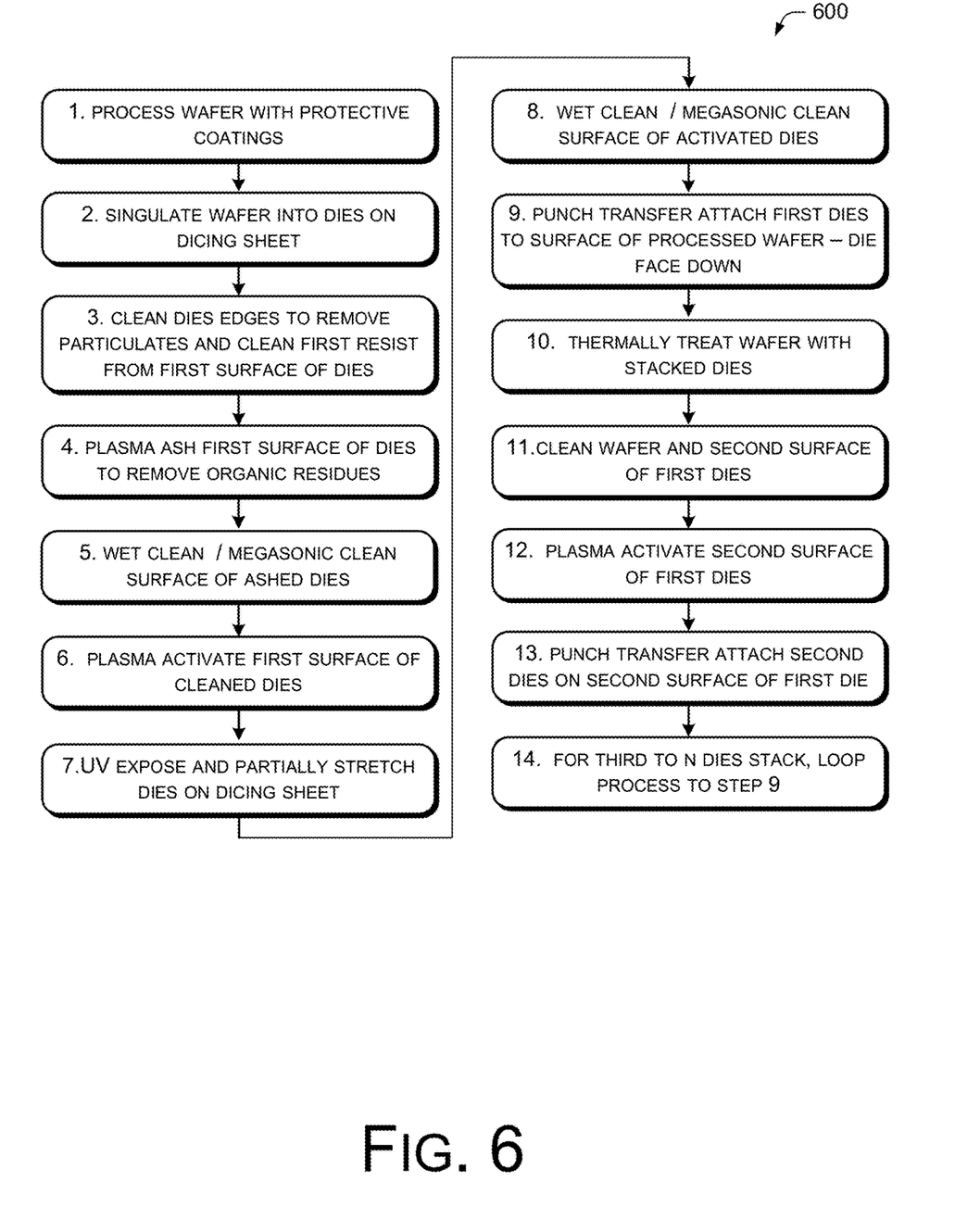
FIG. 6 is a textual flow diagram illustrating an example die processing sequence performed on a dicing tape or device processing film or surface, according to a second embodiment.

A second example embodiment 600 for processing dies 310 on a dicing sheet 306 is shown at FIG. 6. The example embodiment 600 illustrates that some of the process steps may be performed in a different order, including reducing process steps as well. For example, at blocks 1-3, the wafer 302 is processed with protective coatings 304, singulated into dies 310 on the dicing sheet 306 and cleaned on the dicing sheet 306 as previously described. Optionally, the dicing sheet 306 may be stretched some to accommodate cleaning between the dies 310, and/or the dies 310 may be exposed to UV light to break down the resists 304 and adhesives 308. At block 4, the first surface of the dies 310 is plasma ashed (e.g., oxygen ashing) while the dies 310 remain on the dicing sheet 306, to remove any unwanted organic residue (or other contaminants) from the first surface.

At block 5, the ashed surface of the dies 310 is cleaned using a wet cleaning technique (e.g., deionized water, cleaning solution, etc.) as described above, which may include megasonics, or the like. At block 6, the first surface of the dies 310 is plasma activated (e.g., nitrogen plasma, etc.) to create or enhance bonding for stacking the dies 310. At block 7, the activated dies 310 are exposed to UV light and the dicing sheet 306 is partially stretched. At block 8, the activated dies 310 are cleaned using a wet cleaning technique (e.g., deionized water, hot deionized water, water vapor, or a high pH cleaning solution, etc), that may be enhanced with megasonics, or a combination of cleaning techniques described above, or the like.

At block 9, the dies 310 are transferred from the dicing sheet 306 to the bonding surface 314, and bonded with the first surface "face down" using a DBI hybrid bonding technique, solder bumping, or the like, for example. In the various embodiments, the dies 310 are transferred from the dicing sheet 306 using the "punch" technique described above (including perforating the dicing sheet 306 and transferring the dies 310 using a vacuum tool 408, or the like, while a portion of the dicing sheet 306 remains on the dies 310 to protect the dies 310 from contamination by the vacuum tool 408). At block 10, the dies 310 and substrate

314 are thermally treated (e.g., to 50-150° F.) to strengthen the bond of the dies 310 to the substrate 314. At block 11, the exposed surface ("back surface" or "second surface") of the dies 310 and the substrate 314 are cleaned using chemical and/or mechanical cleaning techniques (e.g., surfactant, non-PVA rotary brush 312, megasonics, etc.). This removes any remaining adhesive 308 or other residue from the back surface of the dies 310. At block 12, the back surface of the dies 310 is plasma activated to prepare for further bonding.

At block 13, additional dies 316 may be punched from the perforated dicing sheet 306 (as described above) and placed "face down" on the back (e.g., exposed) surface of the dies 310 previously placed on the substrate 314, for example. The newly added dies 316 are thermally treated (e.g., block 10) to strengthen the bonds. For additional dies 310, 316 to be added to the stacked die arrangement (e.g., third or more dies), the process is looped back to block 11, and continues until the desired quantity of dies 310, 316 has been added to each stack.

In various examples, the manufacturing process as described can use approximately 10+2(n−1); n>0 steps to complete (where n=the desired quantity of dies 310, 316 in the stack), resulting in further reduction of steps, complexity, and cost.

Figure 7:
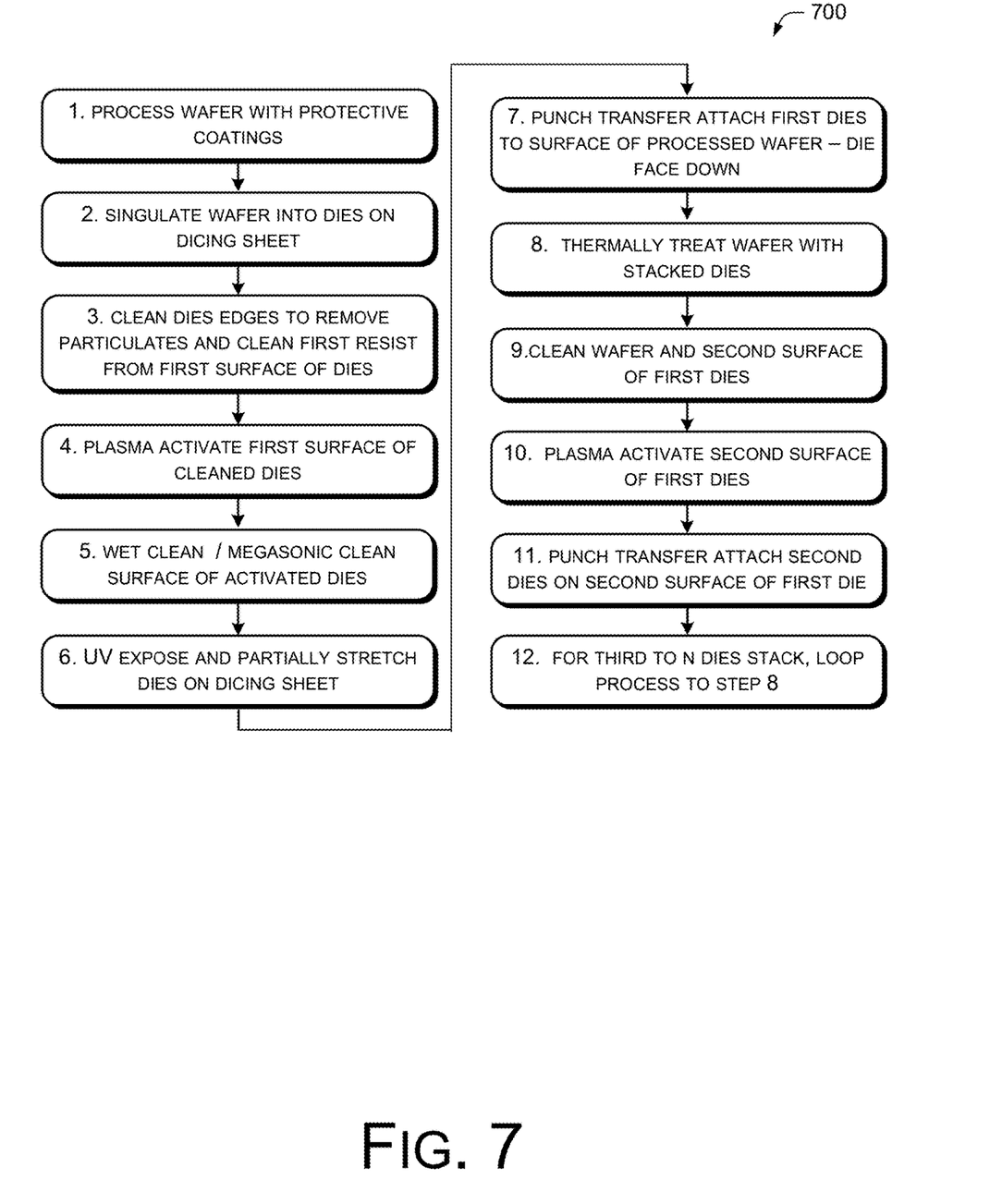
FIG. 7 is a textual flow diagram illustrating an example die processing sequence performed on a dicing tape or device processing film or surface, according to a third embodiment.
Figure 8:
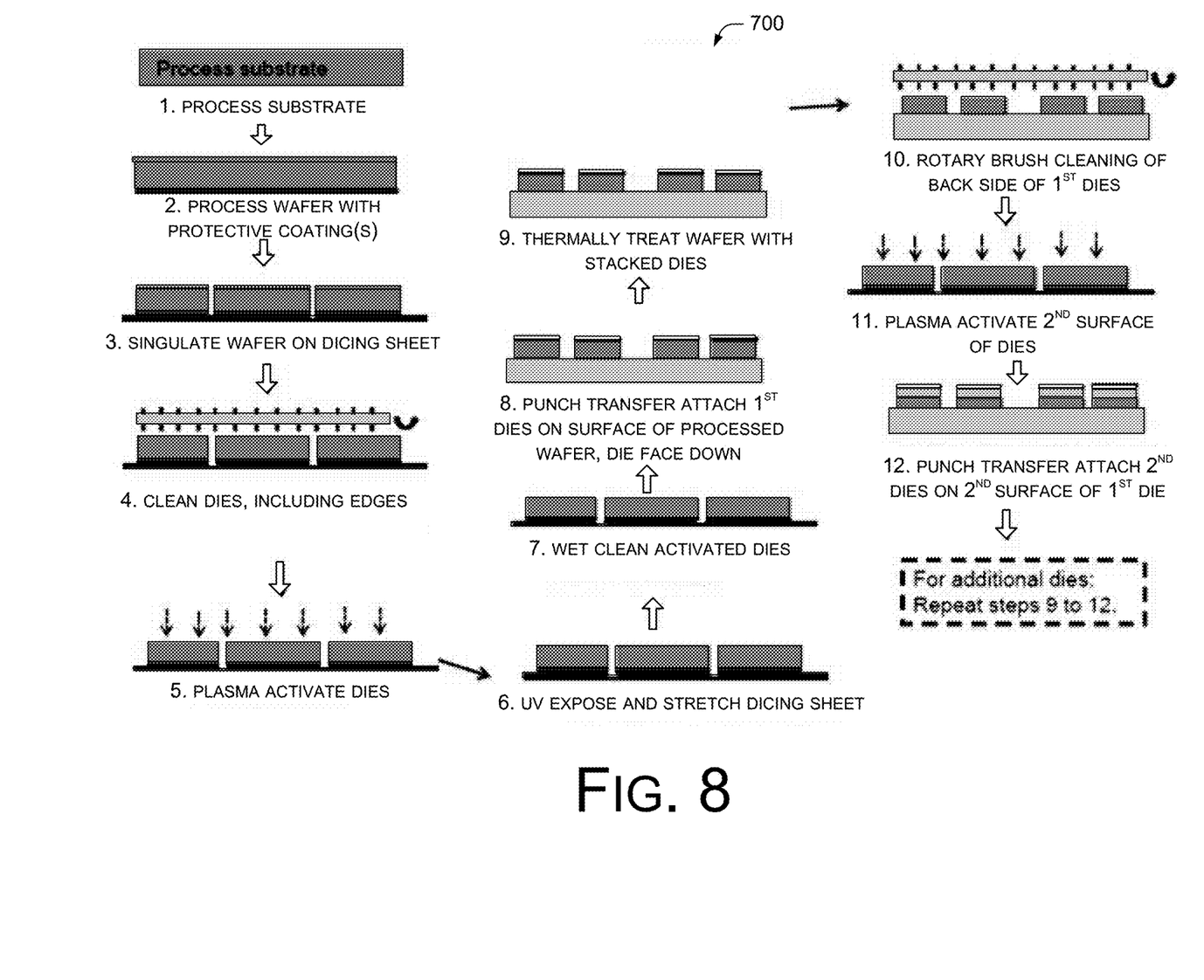
FIG. 8 is a graphical flow diagram of the example die processing sequence of FIG. 7, according to an embodiment.

FIG. 7 is a flow diagram illustrating another example die 310 processing sequence 700 performed on a dicing tape 306, according to a third embodiment. FIG. 8 is a graphical representation of the example die processing sequence 700 of FIG. 7, according to an example implementation. In the example embodiment of FIGS. 7 and 8, the plasma ashing step (i.e., block 4 of FIG. 6) is eliminated, reducing the process steps.

At blocks 1-3, the wafer 302 is processed with protective coatings 304, singulated into dies 310 on the dicing sheet 306 and cleaned on the dicing sheet 306 as previously described. Optionally, the dicing sheet 306 may be stretched some to accommodate cleaning between the dies 310, and/or the dies 310 may be exposed to UV light to break down the resists 304 and adhesives 308. At block 4, the first surface of the dies 310 is plasma activated (e.g., nitrogen plasma, etc.) to create or enhance bonding for stacking the dies 310. At block 5, the activated dies 310 are cleaned using a wet cleaning technique (e.g., deionized water, a high ph cleaning solution, etc), which may include megasonic scrubbing, agitation, or other suitable cleaning techniques. At block 6, the activated dies 310 are exposed to UV light and the dicing sheet 306 is partially stretched.

At block 7, the dies 310 are transferred from the dicing sheet 306 to the bonding surface 314, and bonded with the first surface "face down" using a DBI hybrid bonding technique, solder bumping, or the like. In the various embodiments, the dies 310 are transferred from the dicing sheet 306 using the "punch" technique described above (including perforating the dicing sheet 306 and transferring the dies 310 using a vacuum tool 408, or the like, while a portion of the dicing sheet 306 remains on the dies 310 to protect the dies 310 from contamination by the vacuum tool 408). At block 8, the dies 310 and substrate 314 are thermally treated (e.g., to 50-150° F.) to strengthen the bond of the dies 310 to the substrate 314. At block 9, the exposed surface ("back surface" or "second surface") of the dies 310 and the substrate 314 are cleaned using chemical and/or mechanical cleaning techniques (e.g., surfactant, methanol, non-PVA rotary brush 312, megasonics, etc.). This removes any remaining adhesive 308 or other residue from the back surface of the dies 310. At block 10, the back surface of the dies 310 is plasma activated to prepare for further bonding.

At block 11, additional dies 316 may be punched from the perforated dicing sheet 306 and placed "face down" (e.g., prepared side down) on the back surface (e.g., exposed surface) of the dies 310 previously placed on the substrate 314, for example. The newly added dies 316 are thermally treated (e.g., block 8) to strengthen the bonds. For additional dies 310, 316 to be added to the stacked die arrangement (e.g., third or more dies 310, 316), the process is looped back to block 9, and continues until the desired quantity of dies 310, 316 has been added to each stack.

In various examples, the manufacturing process as described can use approximately 8+2(n−1); n>0 steps to complete (where n=the desired quantity of dies 310, 316 in the stack), resulting in further reduction of steps, complexity, and cost. After the device stacking steps, the stacked dies 310 and the receiving surface 314 may be further treated to a subsequent higher temperature. The treating temperature may range from 80 to 370° C. for times ranging between 15 minutes to up to 5 hours or longer. The lower the treatment temperature, the longer the treatment times.

In one embodiment of the process 700, the wafer 302 to be processed/diced may include interconnects such as solder bumps or other reflowable joining materials (not shown), or the like, on the exposed or first surface. In the embodiment, the reflowable interconnect joining structure or structures are often disposed face up on the dicing sheet 306 or processing sheet, in a manner that the reflowable features do not directly contact the adhesive layer 308 of the dicing sheet 306. The wafer 302 may be processed with protective coatings 304 overlaying the reflowable interconnect structures. The wafer 302 is singulated into dies 310 while on the dicing sheet 306, and cleaned while on the dicing sheet 306 as previously described with respect to blocks 1-3 above. Optionally, the dicing sheet 306 may be stretched some to accommodate cleaning between the dies 310 and the edges of the dies 310, and/or the dies 310 may be exposed to UV light to break down the resists 304 and adhesives 308.

At block 4, the first surface (e.g., exposed surface) of the dies 310 may be cleaned with plasma cleaning methods (e.g., oxygen ashing etc.). At block 5, the dies 310 on the dicing sheet 306 may be further cleaned using a wet cleaning technique as described above (e.g., deionized water, a high ph cleaning solution, etc.), which may include megasonics, agitation, or the like, if desired. At block 6, the cleaned dies 310 and the dicing sheet 306 may be exposed to UV light and the dicing sheet 306 may be further stretched.

At block 7, the dies 310 are transferred from the dicing sheet 306 to the receiving surface 314, and bonded with the first surface "face down" (e.g., prepared surface down) using the techniques described herein. In some embodiments, the receiving substrate 314 may comprise a polymeric layer, a no-fill underfill, or portions of an adhesive sheet, for example. In the various embodiments, the dies 310 are transferred from the dicing sheet 306 using the "punch" technique described above (including perforating the dicing sheet 306 and transferring the dies 310 using a vacuum tool 408, or the like, while a portion of the dicing sheet 306 remains on each of the dies 310 to protect the dies 310 from contamination by the vacuum tool 408).

At block 8, the dies 310 and substrate 314 may be thermally treated to electrically couple the dies 310 to the receiving substrate 314. In some applications, underfill materials may be formed around the bonded device 310 to further mechanically couple the device 310 to the substrate 314 receiving surface. At block 9, the exposed surface of the transferred dies 310 and the substrate 314 are cleaned using chemical and/or mechanical cleaning techniques (e.g., surfactant, methanol, non-PVA rotary brush 312, megasonics, etc.). This removes any remaining adhesive 308 or other residue from the back surface of the dies 310. At block 10, the exposed surface of the transferred dies 310 is plasma activated to prepare for further bonding. In some applications, the bonded devices 310 may be cleaned before the thermal processing to electrically couple the dies 310 to the receiving substrate 314.

Figure 9A:
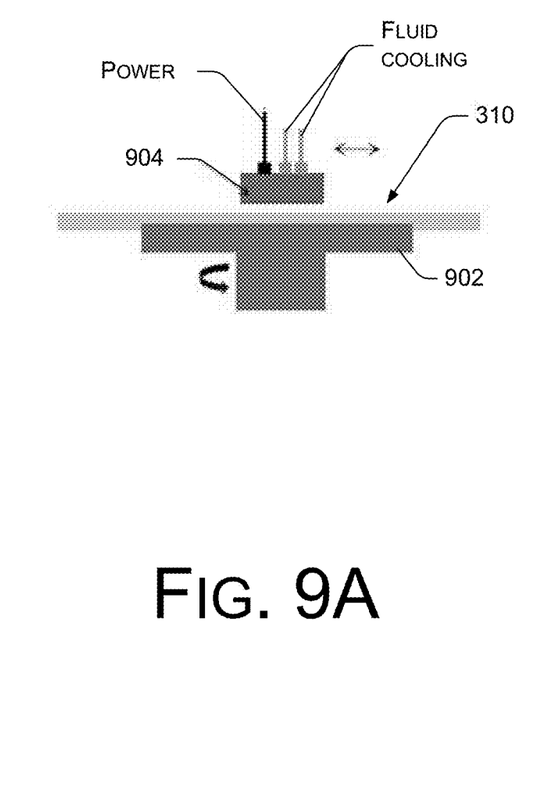
FIGS. 9A and 9B illustrate example die cleaning systems, according to various embodiments.
Figure 9B:
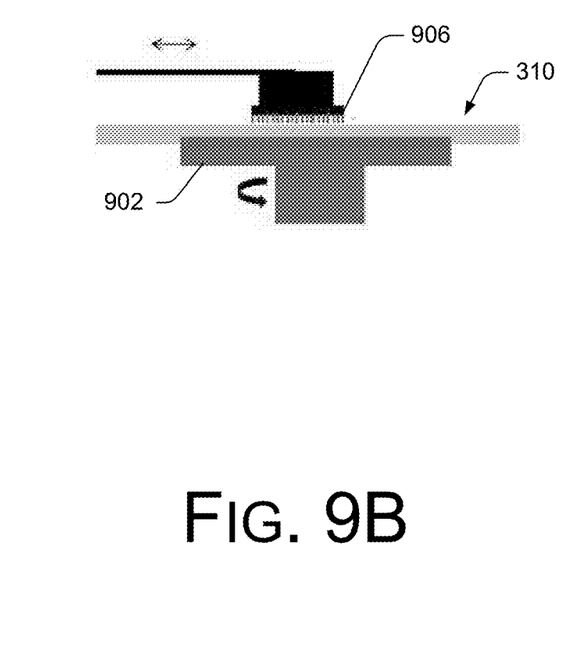

As discussed above, at various processing steps or stages, dies 310, 316 and/or substrates 314 are cleaned using chemical and/or mechanical cleaning techniques (e.g., surfactant, methanol, non-PVA rotary brush 312, megasonics, etc.). FIGS. 9A and 9B illustrate example die cleaning systems, which may be used for this purpose, according to various embodiments. The cleaning processes and systems are described with reference to dies 310, or the receiving surface of the substrate 314, but it is to be understood that the processes and systems are applicable to dies 310, 316 and substrates 314, as well as dielectric surfaces, polymeric layers, conductive layers, interposers, packages, panels, circuits, silicon or non-silicon wafers, and the like.

Referring to FIG. 9A, in an example cleaning sequence, the object(s) to be cleaned (for example, dies 310 or a carrier, etc.) are loaded onto processing equipment 902 (such as a turntable or spin-plate as shown) for cleaning and/or other processing. The cleaning process includes applying proximity megasonic energy to a cleaning fluid, via a megasonic transducer 904, while the dies 310 may be rotated on the turntable 902. The transducer 904 may be scanned back and forth while the dies 310 rotate to improve even application of sonic energy to the dies 310. The sonic energy helps to loosen particles that may be otherwise difficult to remove from the die 310 surfaces.

Referring to FIG. 9B, the transducer 904 is then removed, and the surface of the dies 310 may be brushed clean with a brush 906. The brush 906 may be scanned back and forth while the turntable 902 rotates, for example. If this cleaning process is not successful in removing sufficient particles, the process may be repeated as desired. The dies 310 are rinsed and dried when the cleaning process is complete. However, in some cases this can require multiple cycles, and still may be insufficient to clean all residues from the dies 310.

Figure 10A:
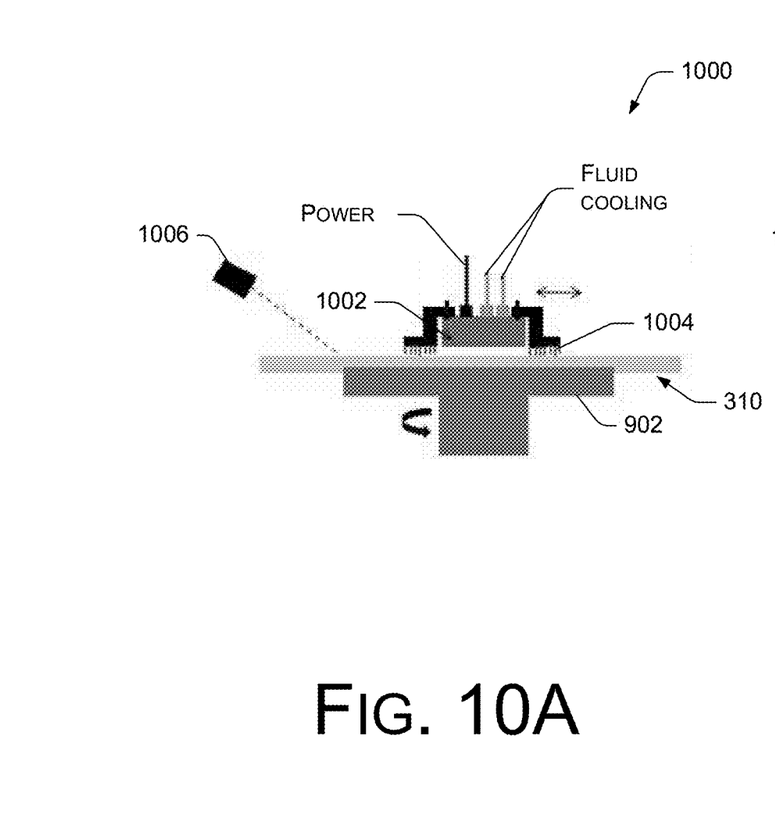
FIGS. 10A and 10B illustrate example die cleaning systems, according to other embodiments.
Figure 10B:
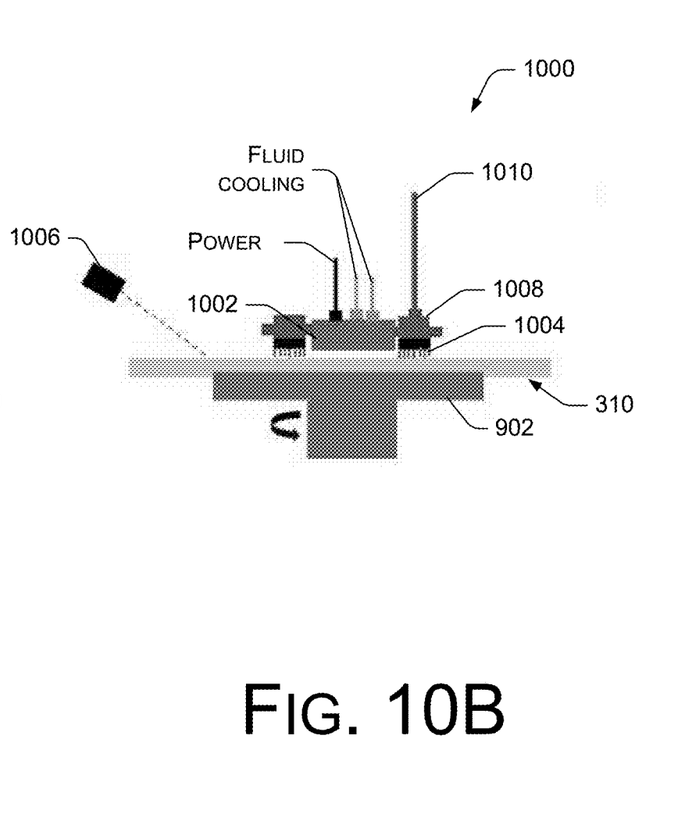

Referring to FIGS. 10A and 10B, techniques and systems provide improved cleaning of die/wafer/substrate surfaces in a single process. FIGS. 10A and 10B illustrate example die 310 cleaning systems 1000, according to various embodiments. An integrated megasonic brush system 1000 is disclosed that includes a megasonic transducer 1002 and one or more brush heads 1004.

In a first embodiment, as shown at FIG. 10A, the integrated megasonic brush system 1000 is placed in proximity to the dies 310 on the turntable 902 (or other process surface). The integrated megasonic brush system 1000 is located so that the transducer 1002 is at an optimal distance from the die 310 surfaces, and so that the brush(es) 1004 have a desired contact pressure on the die 310 surfaces. A cleaning fluid is applied to the die 310 surfaces, for instance. While the transducer 1002 applies sonic energy to the die 310 surfaces via the cleaning fluid, the brush(es) 1004 simultaneously brush particles from the die 310 surfaces. In various implementations, the dies 310 are rotated on the turntable 902 and/or the integrated megasonic brush system 1000 is scanned back and forth for even cleaning.

In an implementation, a fluid height sensor 1006 assists in controlling the amount of cleaning fluid applied to the die 310 surfaces, sending a signal to a cleaning fluid reservoir, for example. In the implementation, the fluid height sensor 1006 is positioned above the die(s) 310 and is arranged to detect a height of a fluid over the die(s) 310. The fluid height sensor 1006 is arranged to send at least a first signal to a fluid source when the height of the fluid is less than a first predetermined amount and a second signal to the fluid source when the height of the fluid is greater than a second predetermined amount. The combination of megasonics and brushing in a single system and process allows more thorough cleaning in the single process, which can eliminate repeated cleaning iterations.

In a second embodiment, as shown at FIG. 10B, the one or more brushes 1004 may be rotated via a rotary unit 1008 while brushing the surfaces of the dies 310. For example, the brush(es) 1004 may be rotated (e.g., the rotary unit 1008 may rotate the brushes 1004) using hydraulics, or any other suitable means (pneumatic, electric, mechanical, etc.), delivered via a conduit 1010, cable, or the like. The additional rotation of the brush(es) 1004 can assist in removing difficult particles from the surfaces of the dies 310 in a single cleaning system and process.

The techniques and systems can prepare the dies 310 to be bonded in stacked arrangements, by providing cleaner bonding surfaces with fewer process steps. After processing and cleaning, the dies 310 can be picked and placed on a die receiving surface 314 (another die, a substrate, etc.) for bonding to the receiving surface 314, as described above. Dies 310 to be stacked and bonded using "Zibond®" and "Direct Bond Interconnect (DBI®)" techniques, which can be susceptible to particles and contaminants, can particularly benefit. The techniques disclosed may also be beneficial to other applications where, for example, the bonding region of the die 310 may include flowable mass material such as any form of solderable material for bonding. Minimizing or eliminating particles or dirt between the bonding surfaces may dramatically improve yield and reliability. Additional benefits include improved efficiency of the cleaning process and the cleaning equipment, more simplified process steps and process equipment, a significant reduction in cleaning cycle time, and the like.

Examples of cleaning cycles wherein the disclosed techniques and systems may be employed include: cleaning the dies 310 after a CMP process, after etching, or the like, cleaning organic (or inorganic) manufacturing and processing layers from the dies 310, cleaning the dies 310 with deionized water (DI), basic or acidic solutions, or slightly basic or slightly acidic formularies, solvents, or their various combinations following plasma ashing the surface of the dies 310, re-cleaning the dies 310 after plasma activating the surface of the dies 310, and so forth. In various embodiments, the ashing step may be omitted and the dies 310 cleaned in the equipment described in FIGS. 10A and 10B, for example. In one embodiment, for example, the protective layer 304 may be cleaned off using the equipment described in FIGS. 10A and 10B using applied sonic energy and mechanical action of the brush 1004 to remove the protective layer 304 with a suitable solvent. To prevent cross contamination of tools and devices, in the subsequent steps the cleaned dies 310 may be transferred to another cleaning station of the type described with reference to FIGS. 10A and 10B for additional cleaning, for example, to eliminate the ashing step or after the activation of the dies 310.

As described in the various preceding paragraphs, the singulated dies 310 may be processed on a carrier 306. In some embodiments, known good dies 310 are removed from the carrier 306 with at least portion of the carrier 306 attached to the second surface of the known good dies 310. A first known good die 310 is attached to a prepared surface of the substrate 314, at the first surface of the first known good die 310. Similarly, a second surface of the first known good die 310 may be cleaned (including cleaning off the portion of the carrier 306) and prepared for bonding of another known good die 316. In practice, the backsides (e.g., second sides) of any of the bonded dies 310, 316 may be prepared, and additional dies 310, 316 may be bonded thereon. Any additional dies 310, 316 may be bonded to the previously bonded dies 310, 316 as desired. In various embodiments, the stacked bonded dies (310, 316, etc.) may range from 1 to 200 dies 310, 316 and preferably between 1 to 100 dies 310, 316 and still preferably between 1 to 20 known good dies 310, 316.

The techniques described can result in better device and package reliability, higher performance, and improved profit margin for ZiBond® and DBI® manufactured devices, and the like. Other advantages of the disclosed techniques will also be apparent to those having skill in the art.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A method comprising:
applying, to a substrate including a wafer, a protective layer to a bonding surface of the wafer;
singulating the wafer and the protective layer into a plurality of semiconductor die components; and
removing the protective layer to expose an individual bonding surface of one or more semiconductor die components of the plurality of semiconductor die components.

2. The method of claim 1, further comprising:
cleaning the individual bonding surface of the one or more semiconductor die components of the plurality of semiconductor die components.

3. The method of claim 2, wherein cleaning the individual bonding surface of the one or more semiconductor die components of the plurality of semiconductor die components comprises mechanically cleaning the individual bonding surface of the one or more semiconductor die components of the plurality of semiconductor die components.

4. The method of claim 2, wherein cleaning the individual bonding surface of the one or more semiconductor die components of the plurality of semiconductor die components comprises chemically cleaning the individual bonding surface of the one or more semiconductor die components of the plurality of semiconductor die components.

5. The method of claim 2, wherein cleaning the individual bonding surface of one or more semiconductor die components of the plurality of semiconductor die components comprises wet cleaning the individual bonding surface of the one or more semiconductor die components of the plurality of semiconductor die components.

6. The method of claim 1, further comprising:
plasma-activating the individual bonding surface of the one or more semiconductor die components of the plurality of semiconductor die components.

7. The method of claim 1, further comprising:
stretching a carrier coupled to the substrate to form gaps between the one or more semiconductor die components of the plurality of semiconductor die components fixed to the carrier; and
perforating the carrier along one or more of the gaps.

8. The method of claim 7, wherein perforating the carrier along the one or more of the gaps comprises perforating the carrier along the one or more of the gaps using one or more of a dicing blade, a hot knife, or an optical knife.

9. The method of claim 7, further comprising:
cleaning one or more edges of the one or more semiconductor die components of the plurality of semiconductor die components while the one or more semiconductor die components of the plurality of semiconductor die components are fixed to the carrier, the edges being exposed in the one or more of the gaps.

10. The method of claim 7, wherein the carrier comprises a dicing sheet.

11. The method of claim 1, wherein the protective layer is a first protective layer on a first bonding surface of the wafer and the substrate comprises a second protective layer on a second bonding surface of the wafer, the second bonding surface being different than the first bonding surface and the method further comprising:
removing the second protective layer after singulating the wafer into the plurality of semiconductor die components.

12. A method comprising:
applying, to a substrate including a wafer, a protective layer to a bonding surface of the wafer, the substrate being coupled to a carrier;
singulating the wafer and the protective layer into a plurality of semiconductor die components;
stretching the carrier to form gaps between one or more semiconductor die components of the plurality of semiconductor die components fixed to the carrier; and
after stretching the carrier, removing the protective layer to expose an individual bonding surface of the one or more semiconductor die components of the plurality of semiconductor die components.

13. The method of claim 12, further comprising:
plasma-activating the individual bonding surface of the one or more semiconductor die components of the plurality of semiconductor die components.

14. The method of claim 12, further comprising:
perforating the carrier along one or more of the gaps.

15. The method of claim 14, wherein perforating the carrier along the one or more of the gaps comprises perforating the carrier along the one or more of the gaps using one or more of a dicing blade, a hot knife, or an optical knife.

16. The method of claim 14, further comprising:
cleaning the individual bonding surface of the one or more semiconductor die components of the plurality of semiconductor die components; and
cleaning edges of the one or more semiconductor die components of the plurality of semiconductor die components, the edges being exposed in the gaps.

17. The method of claim 16 wherein cleaning the individual bonding surface of one or more semiconductor die components of the plurality of semiconductor die components comprises at least one of (i) mechanically cleaning the individual bonding surface, (ii) chemically cleaning the individual bonding surface, or (iii) wet cleaning the individual bonding surface.

18. The method of claim 12, wherein the protective layer is a first protective layer on a first bonding surface of the wafer and the substrate comprises a second protective layer on a second bonding surface of the wafer, the second bonding surface being different than the first bonding surface and the method further comprising:

removing the second protective layer after singulating the wafer into the plurality of semiconductor die components.

* * * * *